US008817150B2

(12) United States Patent
Giffard et al.

(10) Patent No.: US 8,817,150 B2
(45) Date of Patent: Aug. 26, 2014

(54) LINEAR IMAGE SENSOR IN CMOS TECHNOLOGY

(75) Inventors: Benoit Giffard, Grenoble (FR); Yvon Cazaux, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 210 days.

(21) Appl. No.: 13/152,333

(22) Filed: Jun. 3, 2011

(65) Prior Publication Data

US 2011/0298956 A1 Dec. 8, 2011

(30) Foreign Application Priority Data

Jun. 3, 2010 (FR) ...................................... 10 02360

(51) Int. Cl.
*H04N 3/14* (2006.01)
*H04N 5/335* (2011.01)
*H04N 5/374* (2011.01)
*H01L 27/146* (2006.01)
*H04N 5/372* (2011.01)

(52) U.S. Cl.
CPC .......... *H04N 3/1525* (2013.01); *H04N 5/3743* (2013.01); *H01L 27/14643* (2013.01); *H01L 27/14609* (2013.01); *H01L 27/14603* (2013.01); *H04N 5/37206* (2013.01); *H04N 3/155* (2013.01)
USPC ............ 348/308; 348/294; 348/295; 348/311

(58) Field of Classification Search
USPC ................................................. 348/294–324
See application file for complete search history.

(56) References Cited

U.S. PATENT DOCUMENTS

| 4,280,141 | A | 7/1981 | McCann et al. |
| 4,870,293 | A | 9/1989 | Elabd |
| 5,828,408 | A | 10/1998 | Mottin et al. |
| 6,906,749 | B1 | 6/2005 | Fox |
| 7,268,814 | B1 * | 9/2007 | Pain et al. ..................... 348/294 |
| 7,417,243 | B2 | 8/2008 | Katzir et al. |
| 7,675,561 | B2 * | 3/2010 | Lepage ......................... 348/295 |

(Continued)

FOREIGN PATENT DOCUMENTS

| EP | 2 154 879 A1 | 2/2010 |
| FR | 2 906 080 A1 | 3/2008 |

OTHER PUBLICATIONS

Tsai et al., "A Time-Delay-Integration CMOS readout circuit for IR scanning"; 2002; IEEE, pp. 347-350.

(Continued)

*Primary Examiner* — Timothy J Henn
*Assistant Examiner* — Pritham Prabhakher
(74) *Attorney, Agent, or Firm* — Oliff PLC

(57) ABSTRACT

A time-delay-integration image sensor comprises a matrix of pixels organized in rows and columns. Each pixel comprises a first photosensitive element, a storage node and a first transfer element connected between the first photosensitive element and the storage node, Each pixel further comprises a second photosensitive element, a second transfer element connected between the second photosensitive element and the storage node, and a third transfer element connected between the storage node and the second photosensitive element of an adjacent pixel of the column. A control circuit is configured to simultaneously command the first and second transfer elements to on state and the third transfer element to off state, and, in a distinct phase, to simultaneously command the first and third transfer elements to on state and the second transfer element to off state.

9 Claims, 6 Drawing Sheets

(56) References Cited

U.S. PATENT DOCUMENTS

| | | | |
|---|---|---|---|
| 7,796,174 B1* | 9/2010 | Harwit et al. | 348/311 |
| 7,897,902 B2 | 3/2011 | Katzir et al. | |
| 7,952,633 B2 | 5/2011 | Brown et al. | |
| 8,085,327 B2* | 12/2011 | Schrey et al. | 348/308 |
| 8,119,969 B2 | 2/2012 | Katzir et al. | |
| 2004/0159861 A1 | 8/2004 | Mori et al. | |
| 2006/0146157 A1 | 7/2006 | Toros et al. | |
| 2006/0256221 A1 | 11/2006 | Mckee et al. | |
| 2007/0012865 A1 | 1/2007 | Katzir et al. | |
| 2008/0079830 A1* | 4/2008 | Lepage | 348/295 |
| 2008/0210993 A1 | 9/2008 | Oshikubo et al. | |
| 2008/0211940 A1 | 9/2008 | Hynecek | |
| 2009/0009645 A1* | 1/2009 | Schrey et al. | 348/308 |
| 2009/0295971 A1* | 12/2009 | Tsuchiya | 348/311 |
| 2010/0118167 A1 | 5/2010 | Johnson | |
| 2010/0253833 A1* | 10/2010 | Deever et al. | 348/362 |
| 2011/0019044 A1* | 1/2011 | Wang et al. | 348/295 |
| 2011/0128425 A1* | 6/2011 | Schemmann et al. | 348/300 |
| 2011/0279725 A1 | 11/2011 | Cazaux et al. | |
| 2012/0206634 A1 | 8/2012 | Katzir et al. | |

OTHER PUBLICATIONS

Cheng et al., "Time-Delay Integration readout with adjacent pixel signal transfer for CMOS image sensor", 2012 International Symposium on VLSI Design, Automation, and Test (VLSI-DAT); 4 pages.

Yvon Cazaux, U.S. Appl. No. 13/978,792, filed Jul. 9, 2013.

Aug. 23, 2012 French Search Opinion issued in European Application No. 11354031.4 (with translation and translator certification).

Spartiotis et al., "X- and Gamma Ray Imaging Systems based on CdTe-CMOS Detector Technology," IEEE Nuclear Science Symposium Conference Record, 2008, pp. 518-522.

Lepage et al., "Time-Delay-Integration Architectures in CMOS Image Sensors," *IEEE Transactions on Electron Devices*, 2009, vol. 56, No. 11, pp. 2524-2533.

Farrier et al., "A Large Area TDI Image Sensor for Low Light Level Imaging," *IEEE Journal of Solid-State Circuits*, 1980, vol. SC-15, No. 4, pp. 753-758.

Yvon Cazaux et al, U.S. Appl. No. 13/103,492, filed May 9, 2011.

\* cited by examiner

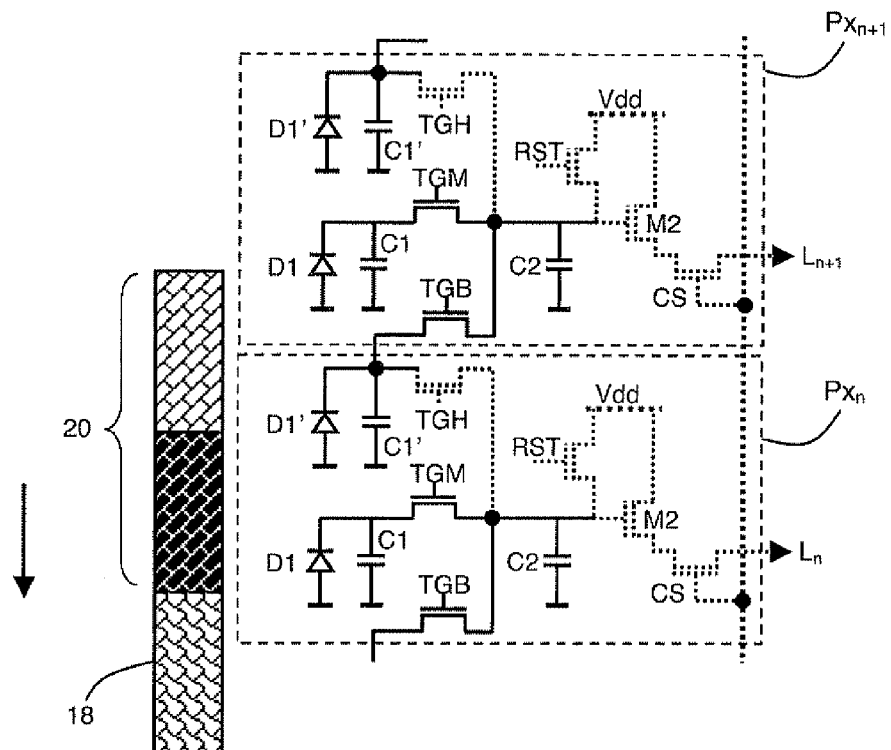
Fig. 8
Fig.9A : RST
Fig.9B : CS (REF)
Fig.9C : Conv (REF)
Fig.9D : TGH
Fig.9E : TGM
Fig.9F : TGB
Fig.9G : CS (SIG)
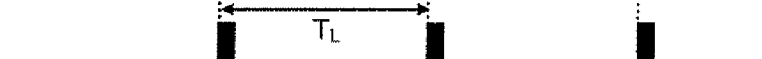
Fig.9H : Conv (SIG)

LINEAR IMAGE SENSOR IN CMOS TECHNOLOGY

BACKGROUND OF THE INVENTION

The invention relates to a linear image sensor designed to capture an image by scanning, and in particular to a Time-Delay-Integration (TDI) sensor.

STATE OF THE ART

The principles of a TDI image sensor are described for example in the article entitled "A Large Area TDI Image Sensor for Low Light Level Imaging" by Michael G. Farrier et al—IEEE Journal of Solid-State Circuits, Vol. SC-15, No. Aug.4, 1980.

A TDI sensor is generally used to capture the image of an object moving at high speed and observed under poor lighting conditions. It is generally implemented using CCD (Charge-Coupled Device) technology which has so far enabled the best performances to be obtained in terms of sensitivity.

FIG. 1 schematically represents a TDI sensor in CCD technology as described in the above-mentioned article. It comprises a matrix of photosensitive sites, or photosites 10 whereof the rows are generally, as represented, considerably longer than the columns. In the example of the above-mentioned article, a row comprises 1028 photosites, whereas a column only comprises 128 photosites. For earth photography via satellite, a row can comprise some 12,000 photosites and the matrix comprises several tens of rows.

The rows of the matrix are arranged perpendicularly to the motion of the object whereof the image is to be captured. Motion of this image relative to the sensor is represented by descending arrows. These arrows also correspond to movement of the electric charges in the CCD registers, in synchronism with the motion of the image.

Each row captures a corresponding slice of the object during an exposure time compatible with the speed of the image. This results in an accumulation of negative charges (electrons) in the photosites of the row.

When a slice of the image captured by a row i is moved to the level of row i+1, the charges accumulated in row i are transferred to row i+1, which, during a new exposure time, continues to accumulate charges for the same slice. Charge transfers from one row to the next therefore take place in synchronism with motion of the image.

At each transfer cycle, the last row of the matrix thus contains the sum of the charges accumulated by all the rows for one and the same slice. The sensitivity of the sensor is therefore in theory multiplied by the number of rows.

At the end of each charge transfer and exposure cycle, the charges of the last row of the matrix are transferred into a shift register 12 whereof the purpose is to read the data of the last row. The charges stored in the photosites of this to register are shifted photosite by photosite to a charge-voltage converter 14 at the end of the row where a voltage corresponding to the total charge of each photosite can be collected by a processing circuit, generally external to the sensor.

As the CCD technology is less and less used for image sensors to the profit of the CMOS technology, the use of the latter technology is envisaged for TDI sensors.

The article entitled "Time-Delay-Integration Architectures in CMOS Image Sensors" by Gerald Lepage, Jan Bogaerts and Guy Meynants—IEEE Transactions on Electron Devices, Vol. 56, N° Nov.11, 2009, describes solutions for obtaining the TDI functionality by means of a CMOS image sensor.

In a CMOS image sensor, light is also captured in the form of charges at pixel level. However, as each pixel is provided with its own voltage read circuit, charges cannot be transferred from one pixel to another.

FIG. 2 schematically represents an architecture envisaged in this article by Lepage et al. A matrix 10' of N×M pixels Px is associated with a matrix 16 of memory cells of the same size and configuration (here N×M=5×5).

In principle, pixel matrix 10' takes views at a rate corresponding to the time (called "line time" $T_L$) taken by an image slice to scan the pitch of the rows of pixels. Thus, after N line times, the same image slice will have been captured by each of the N rows of the pixel matrix. Each row of memory 16 is temporarily associated with the same slice of the image. The brightness levels (i.e signal levels) recorded for this slice by all the rows of pixels is accumulated therein.

Once the levels have been accumulated for the slice, the memory row is read, reset, and associated in circular manner with a new image slice.

It is thus observed that accumulation of all the rows of the pixel matrix has to be performed at each line time.

Whereas in CCD technology the brightness level accumulation operations correspond to simple charge transfers, these operations are notably more complex in CMOS technology. They involve multiplexing operations on pixel read busses, analog-to-digital conversions, addition operations, and memory access operations. This results in difficulties in CMOS technology to achieve the same view capture rates (or line time $I_L$) as in CCD technology. The resolution of the pixel matrix in number of rows therefore has to be adjusted to the minimum line time envisaged and to the desired pixel pitch.

In certain applications, it is sought to improve what is referred to as the image motion Modulation Transfer Function (MTF) which is one of the parameters representative of the sharpness of the reproduced image. A low motion MTF generally results in a blurry image. This loss of resolution is due to the fact that, during a line time, the image slice moves over the row of pixels which is stationary.

As described in the above-mentioned article by Lepage et al., one solution consists in subdividing each pixel in two in the direction of motion. This involves increasing the number of rows of pixels while at the same time reducing the pitch to preserve the dimensions of the sensor. The motion MTF progresses from 0.64 to 0.9 when the pixel is subdivided into two equal parts. On the other hand, the temporal constraints increase with the square of the subdivision factor. They are thus multiplied by 4.

SUMMARY OF THE INVENTION

A need is observed to provide a CMOS image sensor with TDI functionnality enabling the image motion MTF to be improved without however increasing the temporal constraints.

This need tends to be satisfied by providing a time-delay-integration image sensor comprising a matrix of pixels organized in rows and columns, each pixel comprising a first photosensitive element, a storage node and a first transfer element connected between the first photosensitive element and the storage node. Each pixel further comprises a second photosensitive element, a second transfer element connected between the second photosensitive element and the storage node and a third transfer element connected between the storage node and the second photosensitive element of an adjacent pixel of the column. The image sensor comprises a control circuit configured to simultaneously command the first and second transfer elements to on state and the third transfer element to off state, and, in a distinct phase, to simultaneously command the first and third transfer elements to on state and the second transfer element to off state.

A method for management of a time-delay-integration image sensor is also provided.

For each pixel of a column, the method successively comprises the steps of exposure of the first and second photosensitive elements of the pixel during a first half period, transfer of the brightness level of the first photosensitive element to a storage node of the pixel and transfer of the brightness level of the second element photosensitive in the storage node of the pixel, exposure of the first and second photosensitive elements of the pixel during a second half period, transfer of the brightness level of the first photosensitive element to the storage node of the pixel and transfer of the brightness level of the second photosensitive element to the storage node of an adjacent pixel of the column, and read of the brightness levels accumulated in the storage node of the pixel.

BRIEF DESCRIPTION OF THE DRAWINGS

Other advantages and features will become more clearly apparent from the following description of particular embodiments of the invention given for non-restrictive example purposes only and illustrated by means of the appended drawings, in which:

FIGS. 5 to 8 represent operating steps of the pixels of FIG. 4; and

FIGS. 9A to 9H are timing diagrams illustrating a global operation of the pixels of the sensor of FIG. 4.

DESCRIPTION OF A PREFERRED EMBODIMENT OF THE INVENTION

Figure 3:
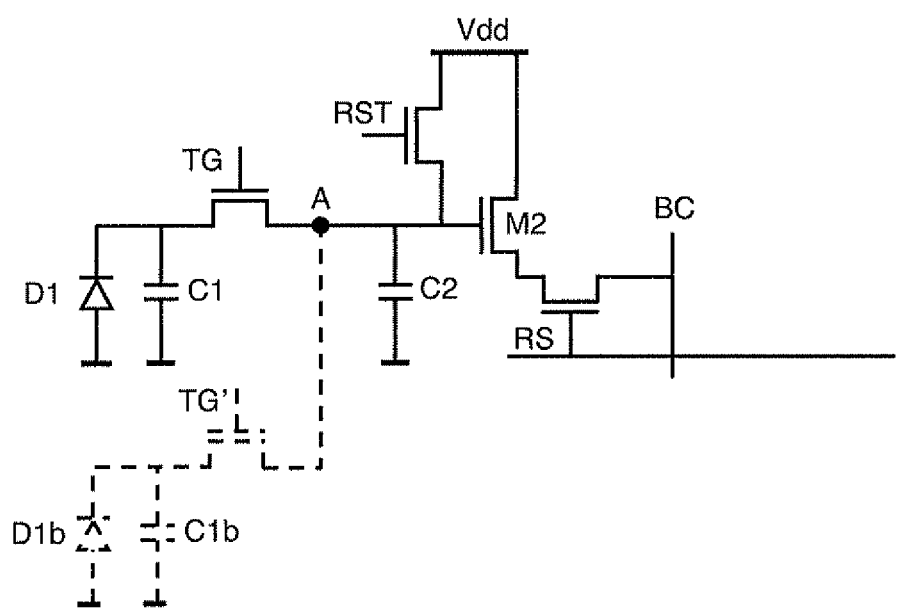
FIG. 3 represents a four-transistor pixel of a CMOS sensor.

FIG. 3 represents a conventional CMOS pixel called "4T" in solid lines. This type of pixel will be thereafter adapted to reduce the motion effect in a TD1 sensor. It comprises a photodiode D1 which has an intrinsic capacitor C1, or integration capacitor, that enables the charges generated by the light striking the pixel to be accumulated. A transfer transistor TG connects photodiode D1 to the gate of a follower transistor M2. The gate capacitor of transistor M2 and the capacitors of the other components connected to one and the same node A form a buffer capacitor C2. A selection transistor RS connects the source of follower transistor M2 to a column bus BC. A reset transistor RST connects capacitor C2 to a positive power supply line Vdd. For reasons of convenience, the control signals of the transistors have the same name as the transistors in the following.

Operation of this pixel is briefly as follows. Capacitor C1 integrates the charges generated by the light striking photodiode D1. Before the end of exposure, transistor RST is briefly activated to reset buffer capacitor C2. At the end of exposure, transistor TG is briefly activated to transfer the charges from capacitor C1 to buffer capacitor C2. If photodiode D1 is a pinned photodiode, transfer of charges is total, also resulting in capacitor C1 being reset by activation of transistor TG.

Thus, during each exposure phase, the voltage level corresponding to the previous exposure is stored in buffer capacitor C2. This voltage level, representative of a brightness level, can be transferred at any time to bus BC by activating selection transistor RS, before reset by transistor RST.

Figure 1:
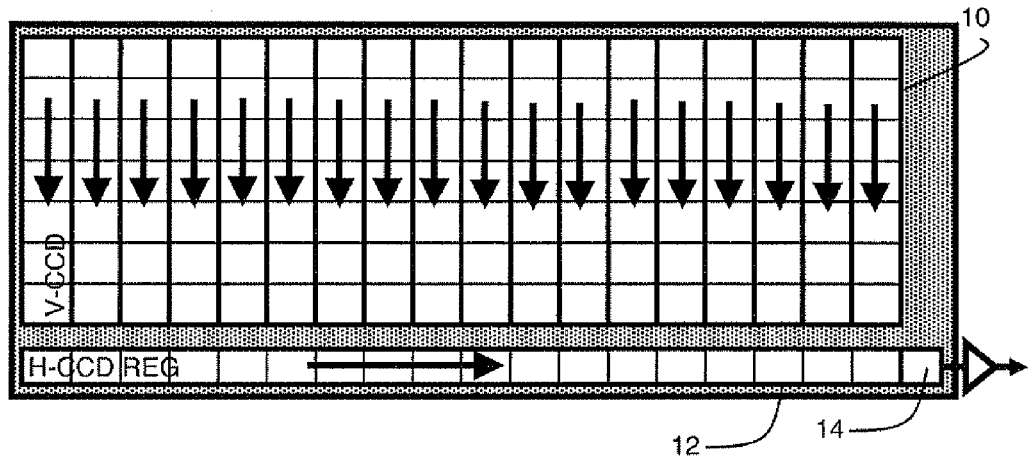
FIG. 1, described in the above, schematically represents a conventional TDI image sensor in CCD technology.
Figure 2:
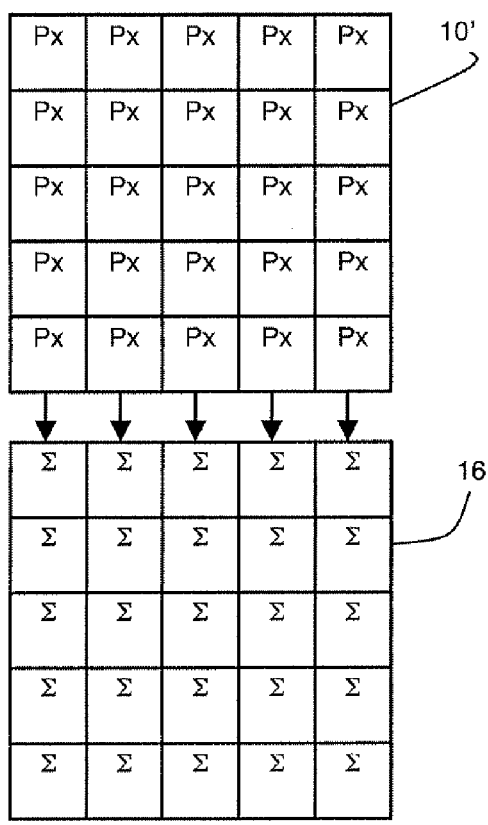
FIG. 2, described in the above, schematically represents a conventional TDI sensor in CMOS technology.

In a pixel matrix according to FIG. 3, the pixels of a column share the same bus BC. The pixels of a column are read row after row and their signals transit to a matrix of memory cells Σ via column bus BC to be stored (FIG. 2). A row is selected by means of signal RS.

Capacitor C2, of relatively low value to minimize read noise, presents on reset a noised level, called reference level, which is added to the signal level (i.e the desired level) transferred from capacitor C1. To attenuate the effect of this noise, Correlated Double Sampling (CDS) is generally performed, i.e. the reference levels of the pixels are first sampled, and are then subtracted from the sampled signal levels after transfer from capacitor C1. This difference is generally made in an external memory (not represented).

Another type of pixel, called "shared pixel", as described in US Patent application US200610256221, can be derived from that of FIG. 3 by adding the elements in dashed lines, i.e. a second photodiode D1$b$ connected to node A by a second transfer transistor TG'. The object of this structure is to reduce the space occupation of the pixels by sharing a read circuit between several photodiodes. The level of each photodiode is transferred separately to bus BC in a phase as described in the foregoing. Capacitor C2 is thus reset at the beginning of each of these two phases and cannot be used, as in a simple 4T pixel, to store the information of a previous image during acquisition of a current image.

Figure 4:
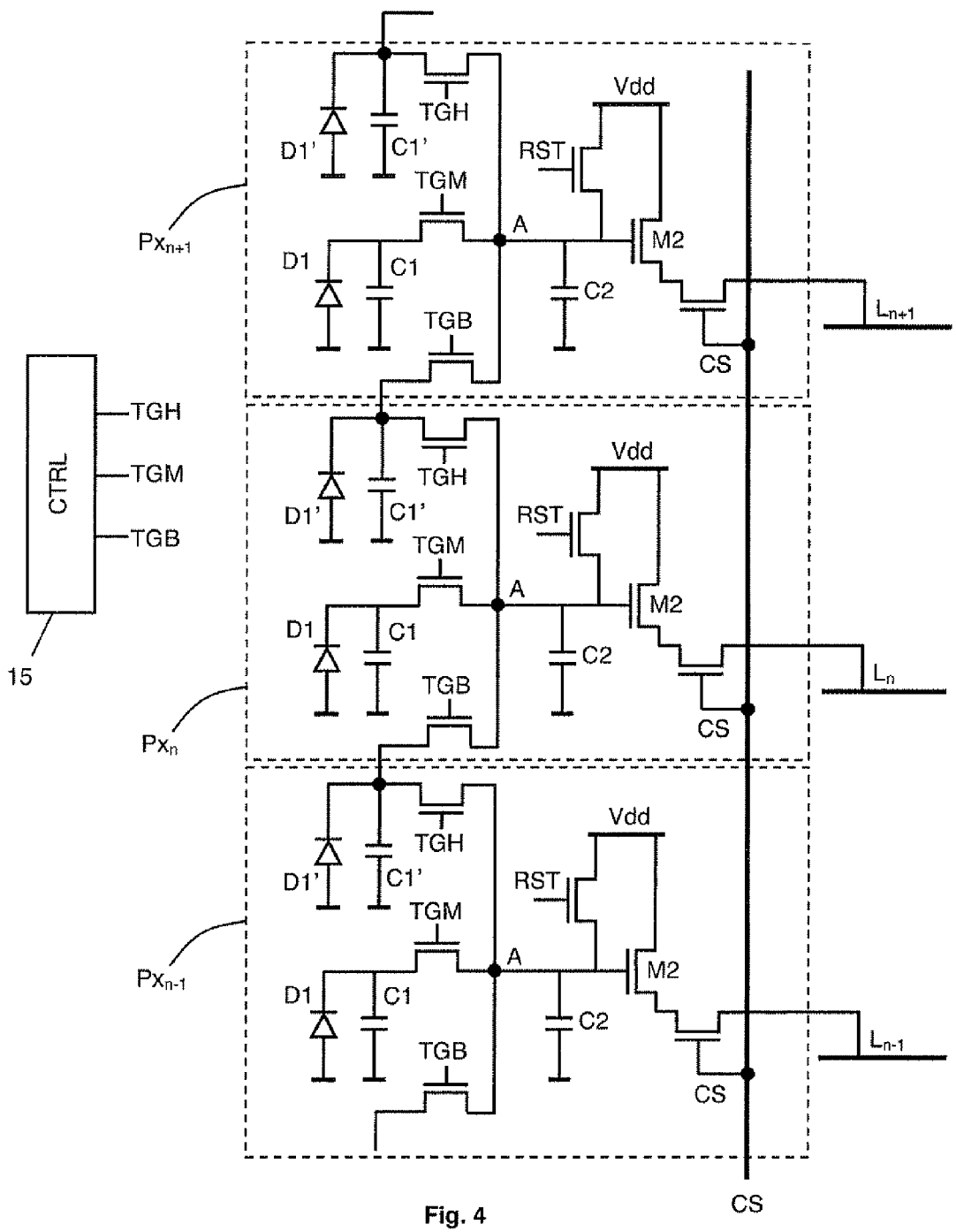
FIG. 4 schematically represents a column of a CMOS TDI sensor enabling the image motion MTF to be improved.

FIG. 4 represents a column of pixels Px modified in order to improve the motion MTF.

To improve the motion MTF, two photodiodes are provided in each pixel. Integration of the charges associated with an image slice no longer takes place during a line time in a single photodiode, but during two half line times in two distinct photodiodes. This means that, by suitably organizing the charge transfers of these photodiodes, integration of the charges can be synchronized with scrolling of the image with greater fidelity, thereby limiting the motion effect (or "moving effect") to a half line time (or to a pixel half-pitch).

Each pixel Px structurally looks like a shared pixel. It comprises two photosensitive elements D1 and D1' aligned in the direction of the column. The photodiodes are preferably pinned photodiodes of the same dimensions. Photodiode D1 provided with integration capacitor C1 is connected to storage node A (storage capacitor C2) via a transfer element TGM, for example a MOS transistor. In similar manner, second photodiode DI and its integration capacitor C1' are connected to node A via a second transfer transistor TGH.

Unlike a column composed of conventional shared pixels, each pixel comprises a third transfer transistor TGB connecting storage capacitor C2 to photodiode D1' of an adjacent pixel of the column. In FIG. 4, capacitor C2 of pixel Px of row n+1 ($Px_{n+1}$) is connected to photodiode DI of the pixel of row n ($Px_n$), capacitor C2 of the pixel of row n is connected to photodiode D1' of the pixel of row n−1, etc.

As in the circuit of FIG. 3, each pixel is provided with a follower transistor M2, a transistor RST connected to a supply voltage Vdd to reset capacitor C2, and a selection transistor, here referenced CS, to transfer a brightness level to a read bus L. This signal is routed to an analog-to-digital converter (not represented) situated at one end of read bus L.

In this configuration, read bus L is common to all the pixels of the row and there is only one analog-to-digital converter per row. The gates of transistors CS of the column are further connected to one and the same control line, also referenced CS. This control line CS enables a whole column of pixels to be selected for read.

Transistors TGH, TGM and TGB of each pixel $P_X$ of FIG. 4 are controlled by a control circuit 15.

FIGS. 5 to 8 illustrate the operating steps of a column of pixels according to FIG. 4. Successive image slices 18, 20 scroll along the column of pixels in the direction of arrow 22 indicated in FIG. 5. Each image slice is divided into two halves to better illustrate the synchronism between scrolling of the slice and the operating phases of the sensor. Operation is described in the following with relation to any two consecutive pixels $Px_{n+1}$ and $Px_n$.

Figure 5:
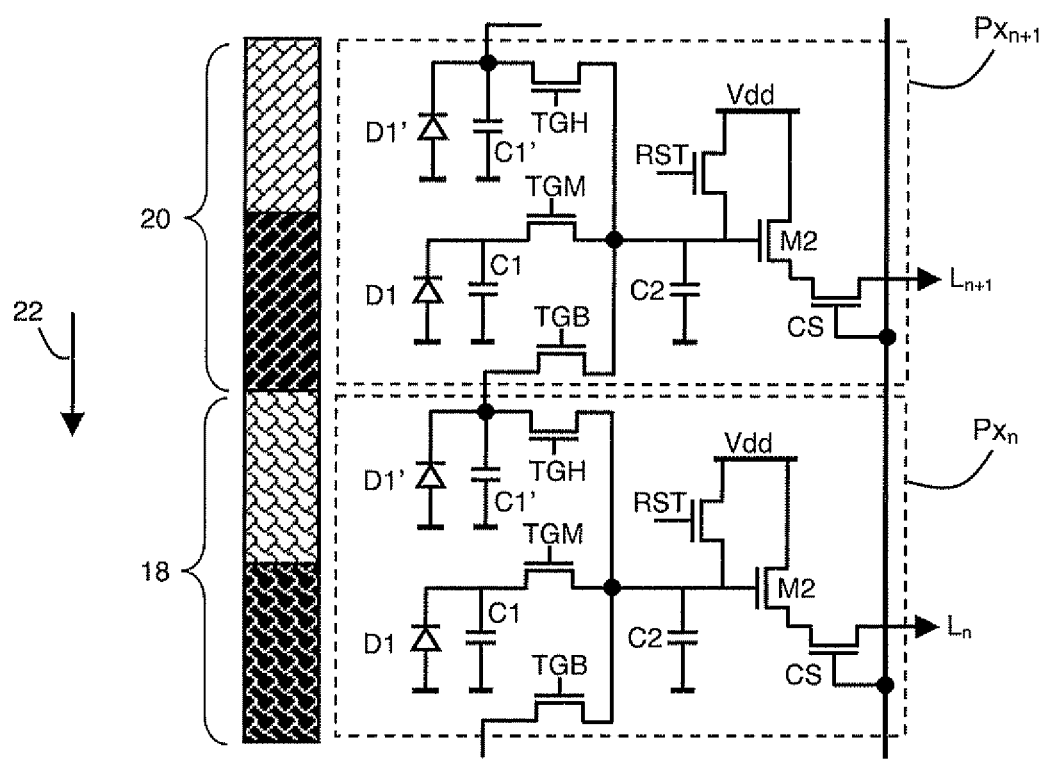

FIG. 5 schematically represents a position of the image with respect to the pixels during a first integration period $T_1$ corresponding to the rolling time of an image half-slice in front of a photodiode. Photodiodes D1 and DI of pixel $Px_n$ are exposed to an image slice 18 and photodiodes D1 and D1' of pixel $Px_{n+1}$ are exposed to an image slice 20. During this period $T_1$, integration capacitors C1 and C1' of each pixel accumulate the charges corresponding to each slice. All the transistors are off.

Figure 6:
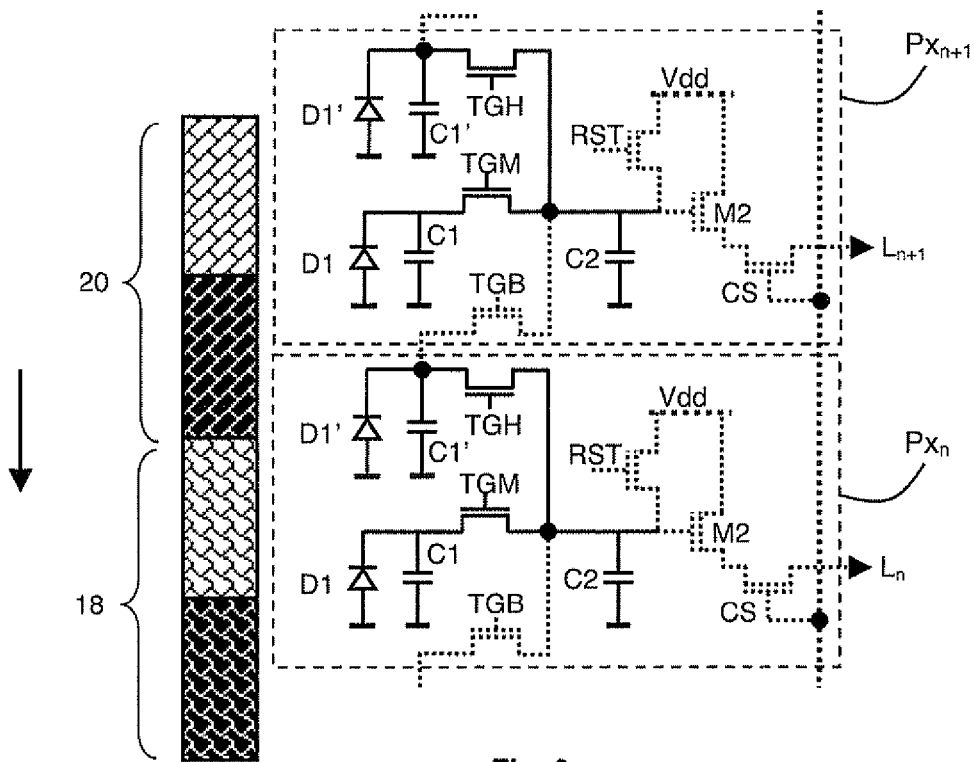

In FIG. 6, at the end of integration period $T_1$, transistors TGH and TGM are turned on and transfer the charges stored in capacitors C1 and C1' of the pixel to capacitor C2 of the pixel. Capacitor C2 of pixel $Px_{n+1}$ receives the charges corresponding to the two halves of slice 20 and capacitor C2 of pixel $Px_n$ receives the charges corresponding to the two halves of slice 18. The other elements of the pixel, represented in dotted lines, are deactivated. Image slices 18 and 20 have moved approximately a half of a pixel pitch during period $T_1$.

Figure 7:
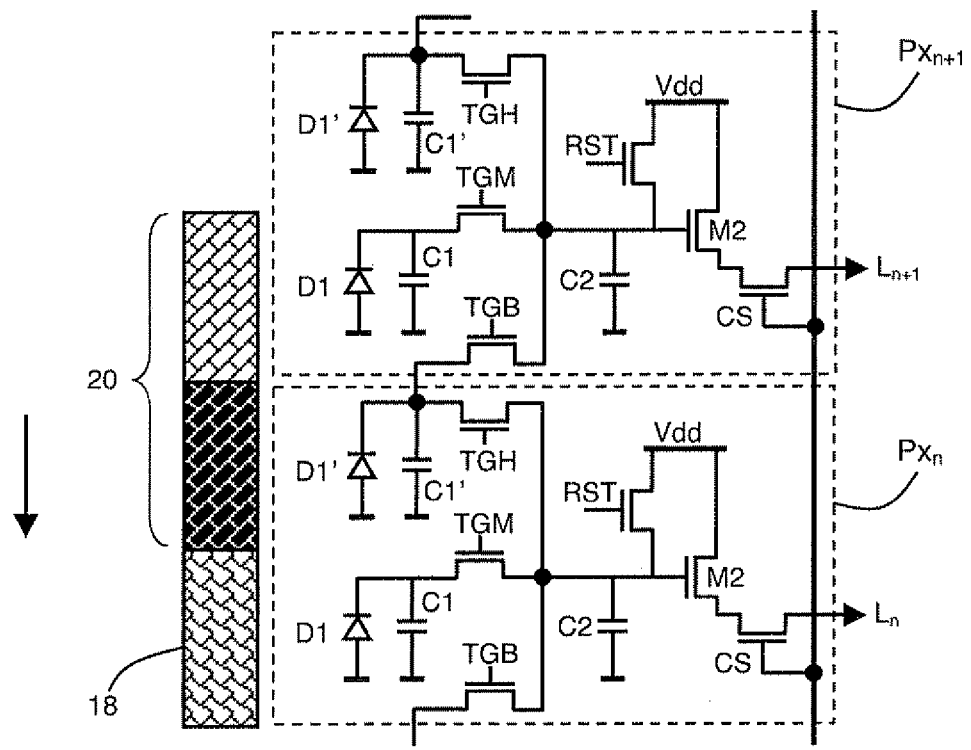

FIG. 7 schematically represents a position of the image during a second integration period $T_2$. Image slice 20 is astride the two adjacent pixels. The bottom part of slice 20 is captured by photodiode DI of pixel $Px_n$ whereas the top part of slice 20 is captured by photodiode D1 of pixel $Px_{n+1}$. This period therefore corresponds to passage of an image slice from a pixel to another. All the transistors are off. During period $T_2$, image slices 18 and 20 will also move a half pitch, thereby marking the end of a line time.

In FIG. 8, at the end of integration period $T_2$, transistors TGB and TGM are activated. In this configuration, the charges corresponding to the two halves of slice 20 integrated during period $T_2$ are again transferred to capacitor C2 of pixel $Px_{n+1}$, where they are accumulated with the charges previously stored in capacitor C2 for the same slice in the step of FIG. 6.

After transistors TGB and TGM have been activated, capacitor C2 of pixel $Px_{n+1}$ groups the brightness levels for two consecutive positions of slice 20 and capacitor C2 of pixel $Px_n$ groups the brightness levels for two consecutive positions of slice 18. These accumulated brightness levels can be extracted from the pixels by means of transistors M2 and CS at the end of period T2. In other words, each pixel contains double resolution data which simply has to be read at single frequency. This enables the motion MTF to be improved without increasing the temporal constraints to read the data.

FIGS. 9A to 9H are timing diagrams summing up the global operation of a column of pixels according to FIG. 4. FIGS. 9A, 9B, 9D to 9G represent the control signals (or states) of transistors RST, CS, TGH, TGM, TGB. Signals 9C and 9H represent the activity of the analog-to-digital converter which processes the data after read via bus L.

Correlated Double Sampling is used to avoid reset noise. Activation of selection transistor CS for read of the reference level REF is represented separately from activation for read of the (accumulated signal) brightness level SIG (FIG. 9B, 9G). Likewise, conversion of level REF is represented separately from that of level SIG (FIG. 9C, 9H).

An exposure time $T_{int}$ of a slice, generally corresponding to line time $T_L$, is defined between two successive activations of transfer transistor TGH or TGB. Integration periods $T_1$ and $T_2$ ($T_1=T_2=T_{int}/2$) take place during this time. The periodicity of the signals reflects processing of the consecutive slices of the image.

The image slice is first of all scanned by photodiodes D1 and D1' of one pixel during period $T_1$, as described in relation with FIG. 5. Before transferring the charges obtained in this way to capacitor C2, capacitor C2 is reset by activating transistor RST (FIG. 9A). Shortly after reset of capacitor C2, transistor CS is activated (FIG. 9B) to read and then convert reference level REF (FIG. 9C). As the conversion time $T_C$ is longer than the duration of a pulse of signal CS, it is represented by a bold line in FIG. 9C.

Once the reference level has been transferred to the converter, transistors TGH and TGM are activated to store the first brightness levels (FIG. 9D, FIG. 9E) which is marks the end of period $T_1$ and the beginning of period $T_2$.

In period $T_2$, the image slice is scanned by photodiode D1 of the same pixel and photodiode D1' of the next pixel. Transfer of the associated brightness levels is performed at the end of period $T_2$ by activation of transistors TGM and TGB (FIG. 9E, FIG. 9F).

Once this charge transfer has been accomplished, the accumulated brightness levels SIG are read by activating transistor CS again (FIG. 9G), and are then sampled by the analog-to-digital converter (FIG. 9H) before being stored in the matrix of memory cells Σ. A new exposure starts with the next slice.

It can be observed that the central transfer transistor TGM is solicited twice as often as transistors TGB and TGH. Indeed, photodiode D1 connected to transistor TGM scans the entire slice (i.e. two half-slices) whereas photodiodes D1' (the one belonging to the pixel and the one belonging to the adjacent pixel) only scan half a slice.

In FIGS. 9D to 9F, transistors TGH and TGM, or transistors TGB and TGM, are commanded simultaneously. They could also be activated one after the other.

During a line time, the pixel matrix has to be entirely read and summed in memory matrix 16. This read is performed column after column (rolling shutter mode) by reading the pixels of each column simultaneously. The converter of a line therefore performs as many conversions as there are columns in the pixel matrix during a line time $T_L$. The timing diagrams of a column adjacent to that of FIG. 4 are simply shifted by a conversion time $T_C$.

Memory matrix 16 being managed in the same way as in the case of a conventional TDI-MOS sensor will not be described in detail in the present application.

Each image slice is thus scanned twice for a movement of one pixel pitch: a first time by photodiode D1 and a second time by photodiode D1' which is staggered a half pixel pitch with respect to photodiode D1. This particular oversampling enables the image motion MTF to be significantly improved, going from 0.637 to about 0.9 (calculated at the Nyquist frequency). Unlike prior art techniques, the pitch of a pixel is not modified, neither is the spatial resolution of the image. The time constraints are therefore unchanged.

Actually, the temporal constraints are imposed by the read circuit and the analog-to-digital converter. Indeed, for a matrix of m columns, m conversions (or 2m conversions in the case of CDS) have to be performed in a line time $T_L$. The line time being predetermined according to the scanning rate of the image and the pitch, it is the speed of the read and conversion circuit that limits the number of columns of the matrix.

The invention claimed is:

1. A time-delay-integration image sensor including a matrix of pixels organized in rows and columns, each pixel comprising:
   a first photosensitive element;
   a storage node;
   a first transfer element connected between the first photosensitive element and the storage node;
   a second photosensitive element;
   a second transfer element connected between the second photosensitive element and the storage node; and
   a third transfer element connected between the storage node and the second photosensitive element of an adjacent pixel of the column, wherein
   the image sensor includes a control circuit configured to simultaneously command the first and second transfer elements of each pixel to an on state and the third transfer element of each pixel to an off state, and in a distinct phase, to simultaneously command the first and third transfer elements of each pixel to the on state and the second transfer element of each pixel to the off state, and
   the storage node is connected to the first transfer element, the second transfer element and the third transfer element in each pixel.

2. The image sensor according to claim 1, further comprising:
   for each row of pixels, a read bus common to the pixels of the row; and
   for each column of pixels, a read selection line common to the pixels of the column.

3. The image sensor according to claim 2, further comprising:
   a matrix of memory cells connected to the read busses to store accumulated brightness levels of several rows of pixels in a row of memory cells.

4. The image sensor according to claim 1, further comprising:
   means for performing correlated double sampling of each pixel.

5. The image sensor according to claim 1, wherein the first and second photosensitive elements are pinned diodes of the same dimensions.

6. A method for management of a time-delay-integration image sensor including a matrix of pixels organized in rows and columns, the method comprising, for each pixel of a column successive steps of:
   exposing first and second photosensitive elements of the pixel during a first half period of an integration period;
   transferring the brightness level of the first photosensitive element to a storage node of the pixel and transferring the brightness level of the second photosensitive element to the storage node of the pixel in the first half period;
   exposing the first and second photosensitive elements of the pixel during a second half period of the integration period;
   transferring the brightness level of the first photosensitive element to the storage node of the pixel and transferring the brightness level of the second photosensitive element to a storage node of an adjacent pixel of the column in the second half period; and
   reading the accumulated brightness levels in the storage nodes of the pixels.

7. The method according to claim 6, further comprising:
   reading a reference level of the pixel before each read of the accumulated brightness levels of the pixel; and
   subtracting the reference level from the accumulated brightness levels.

8. The method according to claim 6, wherein the pixels of one and the same column are commanded simultaneously and the columns are addressed successively during one and the same period.

9. The method according to claim 6, wherein a number of photosensitive elements in the pixel in the first half period is equal to a number of photosensitive elements in the pixel in the second half period.

* * * * *